United States Patent [19]
Loomis et al.

[11] Patent Number: 5,769,297
[45] Date of Patent: Jun. 23, 1998

[54] APPARATUS AND METHOD FOR DICING SEMICONDUCTOR WAFERS

[76] Inventors: James W. Loomis, 1329 Allyn Ave., St. Helena, Calif. 94574; Richard T. Tweedie, 4715 Muirfield Dr., Santa Rosa, Calif. 95405

[21] Appl. No.: 711,556

[22] Filed: Sep. 10, 1996

Related U.S. Application Data

[63] Continuation of Ser. No. 277,622, Jul. 20, 1994, abandoned.

[51] Int. Cl.$^6$ ........................................... B26F 3/00
[52] U.S. Cl. ............................ 225/96.5; 225/103
[58] Field of Search .................... 225/2, 96.5, 100, 225/103, 104; 269/6

[56] References Cited

U.S. PATENT DOCUMENTS

| | | | |
|---|---|---|---|
| 3,567,986 | 3/1971 | Wark et al. | 225/2 |
| 3,657,791 | 4/1972 | Hobbs | 225/96.5 X |
| 4,018,372 | 4/1977 | Insolio | 225/2 |
| 4,109,841 | 8/1978 | DeTorre | 225/96.5 |
| 4,545,515 | 10/1985 | Kozyrski | 225/96.5 |
| 4,653,680 | 3/1987 | Regan | 225/103 X |

*Primary Examiner*—Maurina T. Rachuba
*Attorney, Agent, or Firm*—Howard L. Rose

[57] ABSTRACT

A wafer to be diced to form chips is placed on the sticky side of a thin elastic film in the form of a Swiss Cross which is secured to the side members of a compressed but expandable square frame, the frame being placed in a scribing and dicing machine in its released state so that the frame and thus the film can expand during the dicing operation, further expansion being accomplished after dicing of the wafer by heating the film while in an expansion fixture to insure removal of the chips from the film without damaging adjacent chips. The sticky material on the film may be rendered less sticky after formation of the chips by exposure to ultraviolet energy or the like.

20 Claims, 5 Drawing Sheets

U.S. Patent    Jun. 23, 1998    Sheet 1 of 5    5,769,297
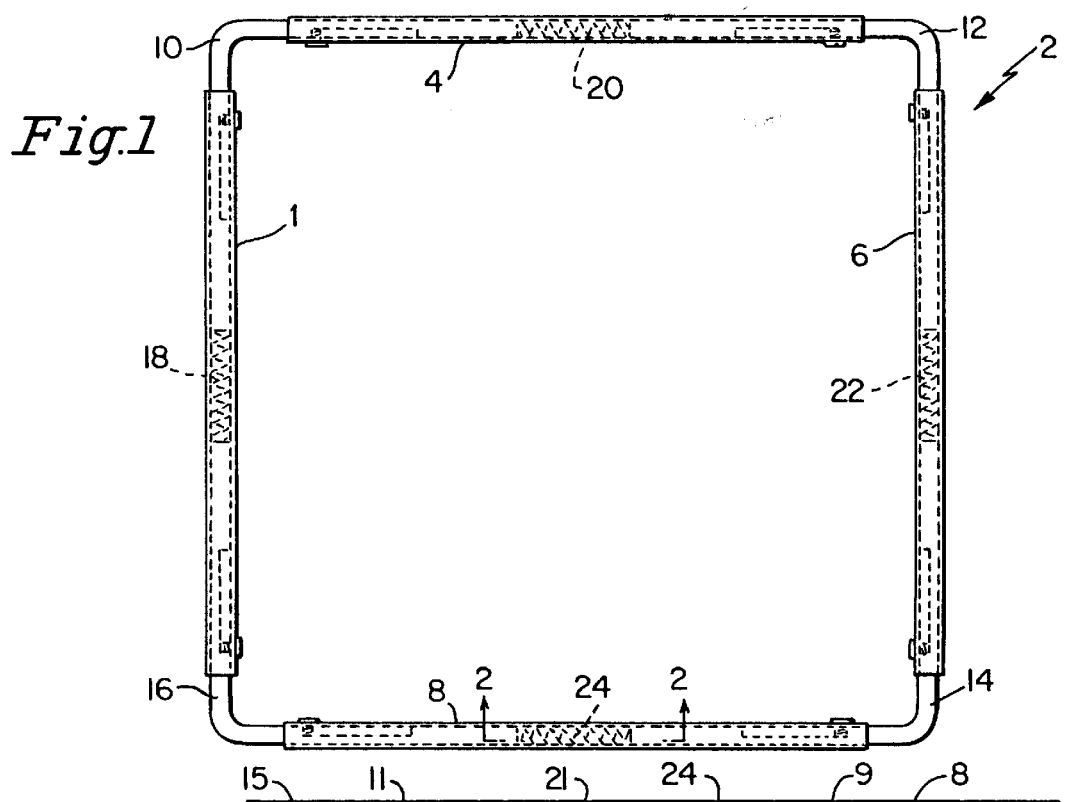
Fig.1
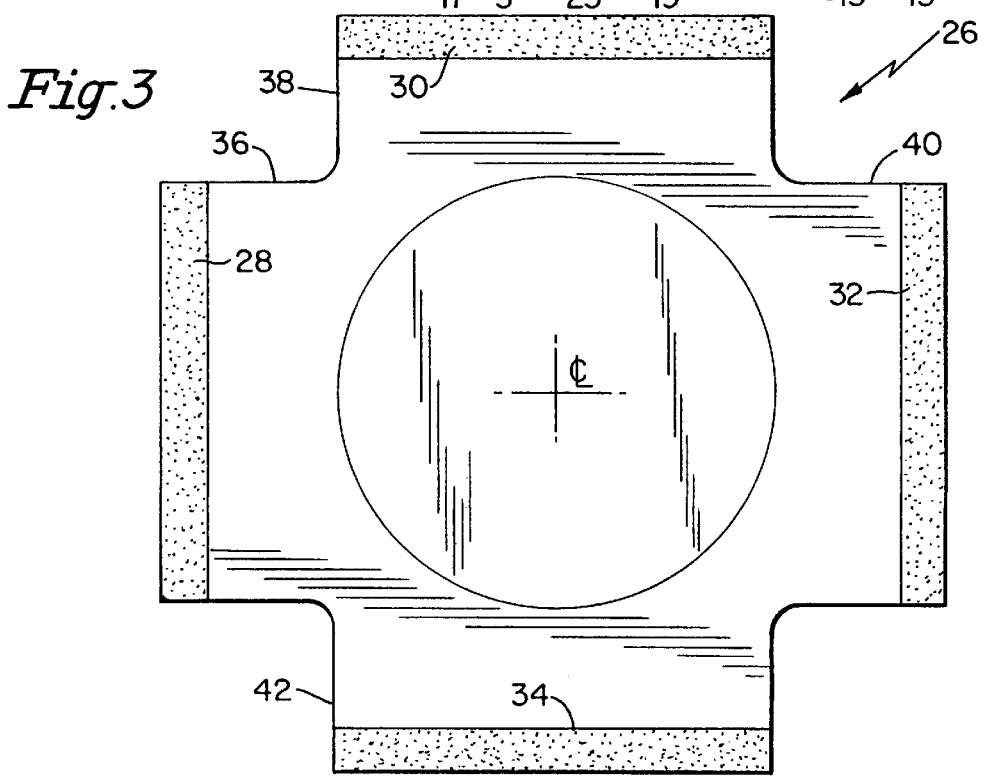
Fig.2
Fig.3

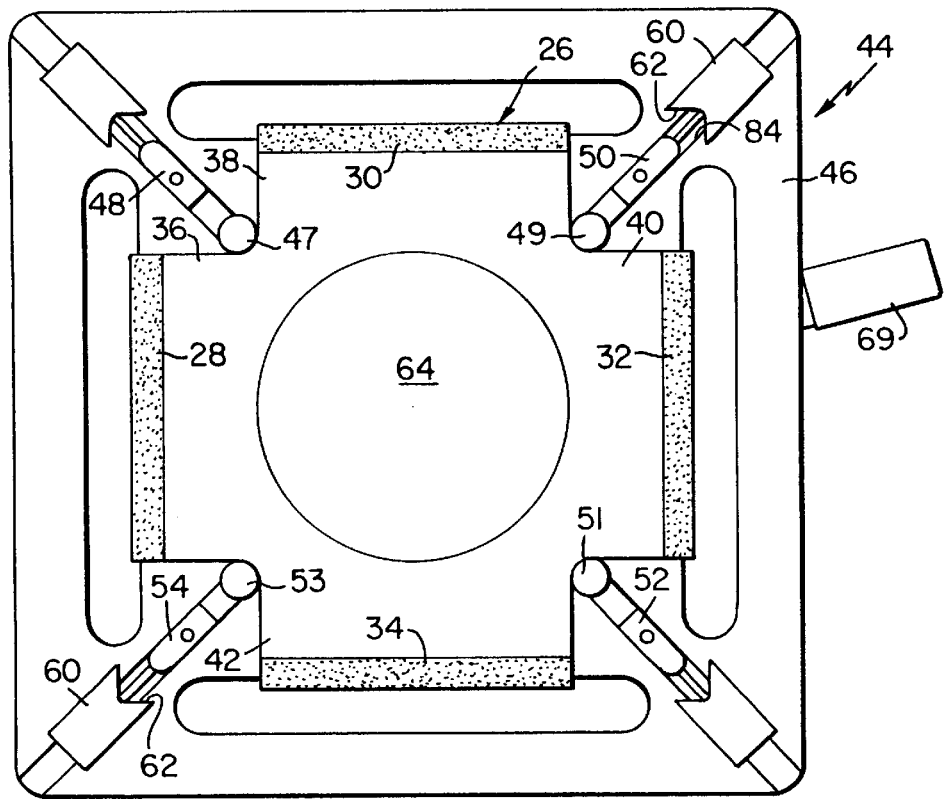
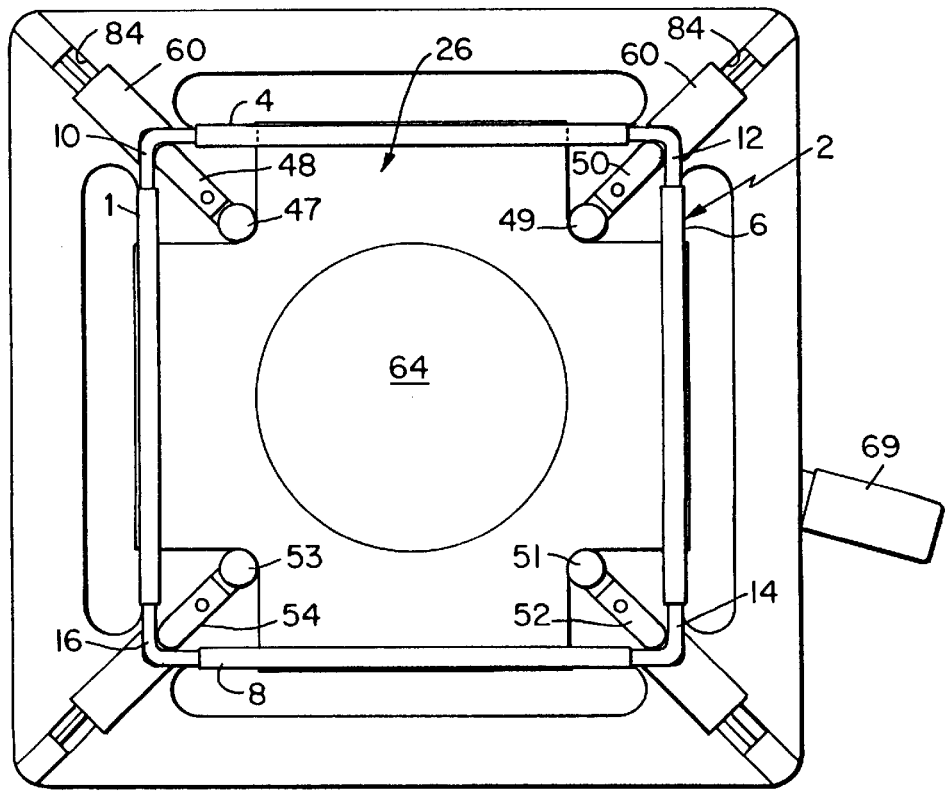

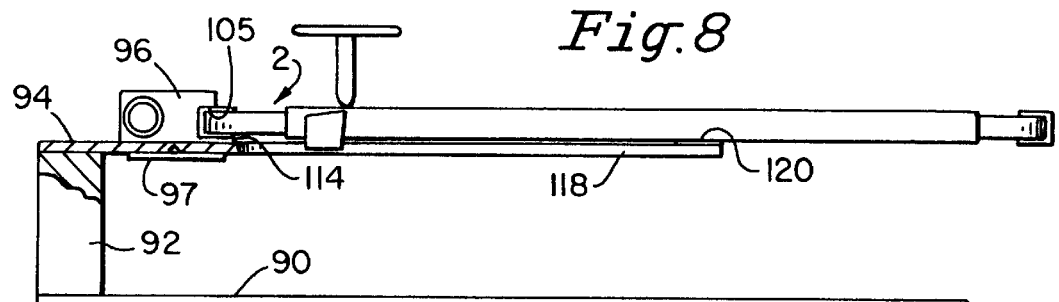
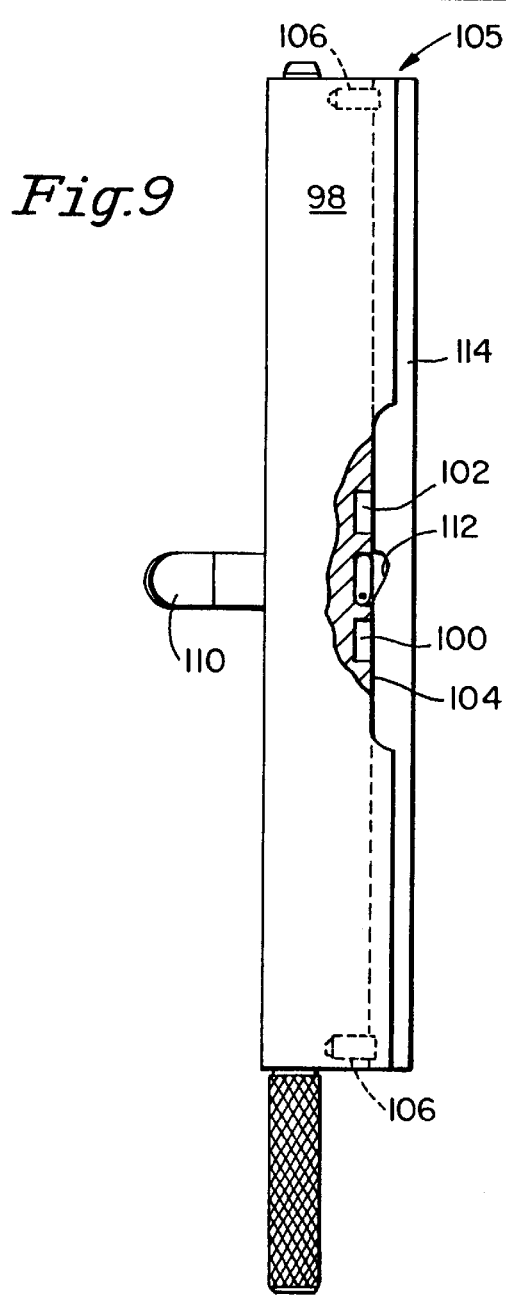
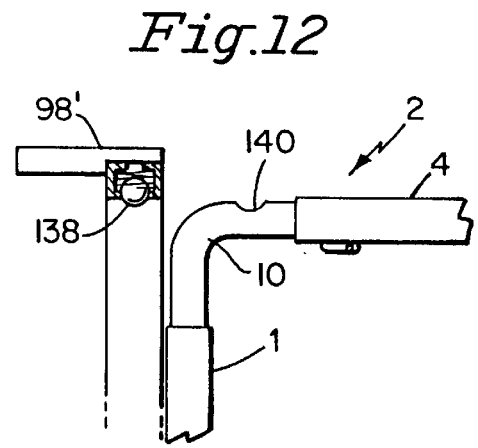

APPARATUS AND METHOD FOR DICING SEMICONDUCTOR WAFERS

RELATED APPLICATIONS

The present application is a continuation of application Ser. No. 08/277,622, filed Jul. 20, 1994 related to application Ser. No. 07/804,135 filed Dec. 6, 1991, now abandoned. A continuation-in-part of Ser. No. 07/804,135 was filed on Aug. 20, 1993 and received application Ser. No. 08/110,178, now abandoned. A file-wrapper-continuation of Ser. No. 08/110,178 was filed on Jan. 24, 1995 and received application Ser. No. 08/377,484 which issued as U.S. Pat. No. 5,458,269 on Oct. 17, 1995. A division of application Ser. No. 07/804,135 was filed Aug. 20, 1993 and received application Ser. No. 08/109,760, now abandoned. A continuation of Ser. No. 08/109,760 was filed on Oct. 28, 1994 and received application Ser. No. 08/331,253, now abandoned. A continuation of Ser. No. 08/331,253 was filed on Feb. 29, 1996, application Ser. No. 08/608,952 pending examination.

FIELD OF THE INVENTION

The present invention relates to an apparatus and method for dicing semiconductor wafers and other frangible materials and more particularly to an apparatus for and method of dicing wafers by scribing and breaking a large wafer while preventing adjacent diced wafers from damaging one another during dicing and the pick and place operation.

BACKGROUND OF THE INVENTION

Dicing a semiconductor wafer while it is adhered to a flexible film is a desirable production technique because the dice maintain their original x-y coordinate positions after dicing. If their positional relationship is maintained, test information derived from testing every die, while they are integral, can be related to them after dicing.

When the dicing process is accomplished by sawing, the saw cut removes enough material between the dice to isolate each die from one another to prevent adjacent dice from hitting one another when the dice are removed from the adhesive film. This removal technique is commonly called "pick and place". Since saw dicing is the prevalent method, dicing on adhesive film and using pick and place techniques is almost mandatory in the semiconductor industry.

A recent semiconductor technology is employing a semiconductor material, gallium arsenide, which is difficult to saw into dice. It is more efficiently scribed and broken into dice. However, in the scribe and break process no material is removed to create physical isolation of the dice from one another. This lack of physical isolation can, and does, cause the dice to damage each other during scribing and breaking of adjacent rows. Also pick and place cannot be accomplished. Thus the wafer must grow when it is transformed from one piece into 200 to 30,000 pieces depending on surface area of the dice. Compounding the problem even further, the break process necessitates bending the dice relative to one another. To make a scribe and break process which holds the wafer and resultant dice on adhesive film requires a method of gradually stretching the film as the wafer is segmented.

Semiconductor wafers are shaped like a round disk. As a result, most film holding systems are circular and a further result is all stretching mechanisms create radial stretch.

Radial stretch creates a problem with the scribe and break process because the wafer is segmented bilaterally (x and y), not radially. The order of events for dicing with scribe and break is to segment the wafer into strips and segment the strips into dice. To prevent damage, that is, prevent the strips from touching and the dice from touching, a method for holding and placing bilateral tension on the film is necessary.

OBJECTS OF THE INVENTION

It is an object of the present invention to stretch a diced wafer mounted on an elastic base in the x-y mode; that is, bilaterally during dicing.

It is another object of the present invention to provide a method of and apparatus for applying an x-y stretch to a stretchable material on which a diced semiconductor wafer is mounted.

Yet another object of the present invention is to mount a stretchable material on which is to be disposed a semiconductor wafer on a frame that exerts a bilateral force on the stretchable material.

Still another object of the present invention is to provide a method for applying an x-y force to a semiconductor wafer that has been diced by the scribe and break method whereby to provide sufficient spacing between the diced chips to permit the dice to be removed by the pick and place technique.

BRIEF DESCRIPTION OF THE PRESENT INVENTION

To accomplish bilateral expansion, a square frame is created, which is used to hold tape shaped like a Swiss Cross. In the alternative the frame may be in the shape of a Swiss Cross. The frame is constructed with hollow square tubing on all sides of the square with right angle corner rods/tubes inside adjacent side tubes in a telescopic fashion. In the center of each side tube is a symmetrically expanding spring arrangement which pushes on and insures equal movement of the ends of the corner pieces. The key word is symmetric movement of the spring system. When the frame is compressed and the Swiss Cross tape is attached to the sides, it exerts, upon release, a bilateral tensile load on the tape that attempts to expand the tape in a symmetrical fashion in both x and y directions independently. The frame and tape are held in a film application fixture which brings the film, frame and wafer together.

The tape and wafer are held in tension by the frame. The tape behaves elastically to the tensile strain except in the area where the wafer is adhered. In this area, reinforcement by the wafer prevents tape elongation. However, when the scribe/break operation takes place, the tape, as the wafer is segmented, is permitted to expand, causing a spacing between the segmented parts. This happens in the x direction as the wafer is segmented into strips and then in the y direction as the strips are segmented into dice.

The frame is mounted on the scribe and break machine of the aforesaid prior applications by a U-shaped member secured to a platform of the machine. The base of the U-shaped member includes a mechanism for rotating the region of the member holding the frame through ±5° to properly align the wafer with the scribe and break mechanism.

Because of the shape of the tape and the way the frame bilaterally and symmetrically applies a tensile load on the tape, the dicing process proceeds without the dice impinging on each other and causing damage.

The final operation after dicing is exaggerated expansion of the spacing between the dice bilaterally by a tape frame expansion fixture. After expansion, the dice are easily accessed from the tape by a pick and place machine. To accommodate existing holding frames in existing pick and place machines, the tape frame expansion fixture allows transfer of the frame to a hoop set or conventional saw frame.

The essentials of the method then consist of mounting a Swiss Cross on a frame that applies an equal (symmetrical) x-y expansion force to the wafer, mounting the wafer on the Swiss Cross, dicing the wafer on a scribe and break machine such as disclosed in the Related Applications, the entire disclosures of which are incorporated herein by reference. The aforesaid frame is then mounted on a mechanism for further expansion with heating of the elastic material to the extent necessary to permit sufficient expansion to separate the individual die to permit them to be removed from the elastic material by the pick and place technique.

Although the present invention is described as applied to the production of semiconductor chips for which the invention was specifically developed, it must be understood that the apparatus and method are equally applicable to the dicing of any wafer-like materials by the scribe and break process as opposed to dicing by sawing.

The above and other features, objects and advantages of the present invention, together with the best means contemplated by the inventor thereof for carrying out the invention will become more apparent from reading the following description of a preferred embodiment and perusing the associated drawings in which:

BRIEF DESCRIPTION OF THE DRAWINGS

FIG. 1 is a top view of a square wafer frame holder on which the elastic member is mounted;

FIG. 2 is a top view of a mechanism for insuring symmetrical expansion of the film;

FIG. 3 of the accompanying drawings illustrates the elastic film in the shape of a Swiss Cross with adhesive on the ends and adhesive on the side opposite for adhering a wafer that is to be mounted on the frame of FIG. 1;

FIG. 4 of the accompanying drawings illustrates the film application fixture employed to position the wafer frame holder and Swiss Cross relative to one another;

FIG. 5 illustrates the film application fixture with the frame of FIG. 1 applied thereto;

FIG. 8 is a view in side elevation illustrating the wafer frame holder applied to the scribe and break machine;

FIG. 9 is a top view partially in section of the top of the mechanism for holding and rotating the wafer frame holder;

FIG. 12 illustrates another structure for holding the wafer frame holder on the scribing and breaking machine.

DETAILED DESCRIPTION OF THE PRESENT INVENTION

Figure 6:
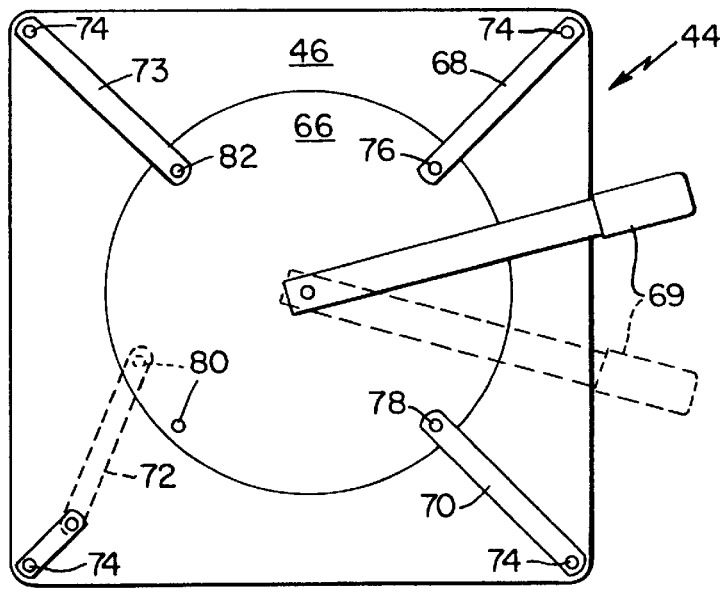
FIG. 6 illustrates an eccentric mechanism located on the underside of the fixture for insuring proper location of the wafer frame holder.

Referring now to FIG. 1 of the accompanying drawings, there is illustrated a wafer frame holder 2 (hereinafter "frame 2") for use in the present invention. The frame 2 has four hollow side members or tubes 1, 4, 6 and 8, preferably rectangular in cross section. Also provided are four corner members 10, 12, 14 and 16 slidably telescoped in tubes 1 and 4, 4 and 6, 6 and 8 and 8 and 1, respectively. Each tube has disposed therein a mechanism to insure that the corner members at each end of a tube 1, 4, 6 and 8 expand equally; otherwise true x expansion or y expansion may not occur. If one corner member moves more than the other either at the two ends of the same side member or at the ends of different parallel side members skewing of the film and thus the scribes will result.

Referring to FIG. 2 of the accompanying drawings, the mechanism for accomplishing the above results is illustrated. A plate 3 is inserted into and secured in the center of each side member. The plate carries two pulleys 5 and 7 with a belt 9 disposed around the pulleys. Two opposed L-shaped members 11 and 13 have thick base legs 15 disposed at right angles to the length of the side member and pressing against, for example, the ends of the corner members 12 and 14. Disposed between the two pulleys is a spring 18 located between two blocks 17 and 19. The block 17 is secured to the belt 9 and leg 21 of the L-shaped member 11 while block 19 is secured to the parallel leg of belt 9 and leg 23 of L-shaped member 13. Thus upon separation of a strip of a wafer from adjacent material of the wafer, the spring 18 separates the L-shaped members by equal movement of each so that the x-y alignment of the strips and chips is maintained.

As indicated, the frame 2 is in the form of a rectangle, preferably a square. Also it is seen that an expanding force is developed by the springs, such as springs 18, in each side member when the frame is compressed to a size smaller than would prevail otherwise.

Referring to FIG. 3 of the accompanying drawings there is illustrated a Swiss Cross 26 of an elastic material such as polyethylene or plasticized PVC employed with the frame 2 of FIG. 1. The film is 5 to 10 microns thick. An adhesive is applied to strips 28, 30, 32 and 34 adjacent and parallel to the ends of each of the arms 36, 38, 40 and 42, respectively, of the Cross 26. Before use the adhesive strips are covered by a removable non-adhesive tape. The opposite surface, the wafer adhesion side, of the elastic material is sticky across its entire surface and is normally covered by non-adhesive tape. The sticky material is avail able from Nitto and Furukawa companies in Japan and Ultron in the U.S. Some of these materials are ultraviolet curable so that when the entire d icing operation is over the material may be rendered less sticky to facilitate removal of the chips from the elastic material or film. Such a material is available from the Furukawa Electric Company in Tokyo as its special polyolefin film UC128M. The sticky material is characteristically one to two microns thick.

Referring now to FIG. 4 of the accompanying drawings, there is illustrated a film application fixture 44 employed to bring the frame, Swiss Cross and wafer together. The frame 44 has mounted on a generally square platform 46 four studs 47, 49, 51 and 53 and slide members 48, 50, 52 and 54. Each stud is located at a different corner of the Cross to be applied and positioned at 45° relative to the adjacent sides of the platform. Each stud is located to exactly define the position of a different one of the junctions of the arms 36, 38, 40 and 42. Each stud is located in line with a different one of slides 48, 50, 52 and 54, each slide being mounted on the platform 46. Mounted on each slide is a different block 60 having a 90° angle 62 formed in its end of a size to engage a corner member, for instance, corner member 10, of the frame 2 of FIG. 1.

After the Swiss Cross 26 has been located on platform 46, with its wafer adhesion side down and adhesive strips up, the frame 2 is placed on the platform 46 over and spaced above the Swiss Cross. Referring to FIG. 5, the blocks 60 are caused to slide inwardly in slots such as slot 84 (see FIG. 6) and engage the corner members of the frame and thus compress and accurately position the frame 2 relative to the Swiss Cross. The non-adhesive tape is then removed from the adhesive strips and the frame is pressed down onto the adhesive strips. The ends of the Swiss Cross are then folded up around the sides of the frame 2 so that the adhesive strips contact the side members of the frame along the bottom, sides and a little of their tops so that the Swiss Cross is now secured to the frame 2.

The blocks 60 are caused to slide by a simple eccentric mechanism on the bottom of the platform 46. Referring to FIG. 6 a circular plate 66 is rotatably secured to the center of the platform 46. A handle 69 is secured to the plate 66 to rotate it. Four arms 68, 70, 72 and 73 are secured at pivots 76, 78, 80 and 82 to plate 66 and lie along 45° lines relative to the square platform 46. The arms 68, 70, 72 and 73 have studs that extend each through a different slot 84 to engage the blocks 60. Upon rotation of the handle 69 in the clockwise direction, the arms all assume the position of the dashed line position of arm 72, pulling the blocks along their respective slots and into engagement with their respective corner members to compress the frame.

Referring again to FIG. 5, the frame 2 and with the Swiss Cross 26 applied is released from the film application fixture 48 by rotating handle 69 counterclockwise. Then the assembly 2 and 26 are removed. The non-adhesive tape covering the wafer adhesive side of the Swiss Cross is a) removed entirely; or b) the center portion is only removed; or c) only the outer portion is removed. Most often the entire non-adhesive cover is removed. A wafer 64 is oriented so the scribe grids (not illustrated) are parallel to sides of frame 2 and adhered to the center of the Swiss Cross in a fashion which avoids air entrapment between the film and wafer. The assembled frame 2, Swiss Cross 26 and wafer 64 are now placed in the scoring and breaking machine of the aforesaid patent application modified only as necessary to support the frame 2.

Figure 7:
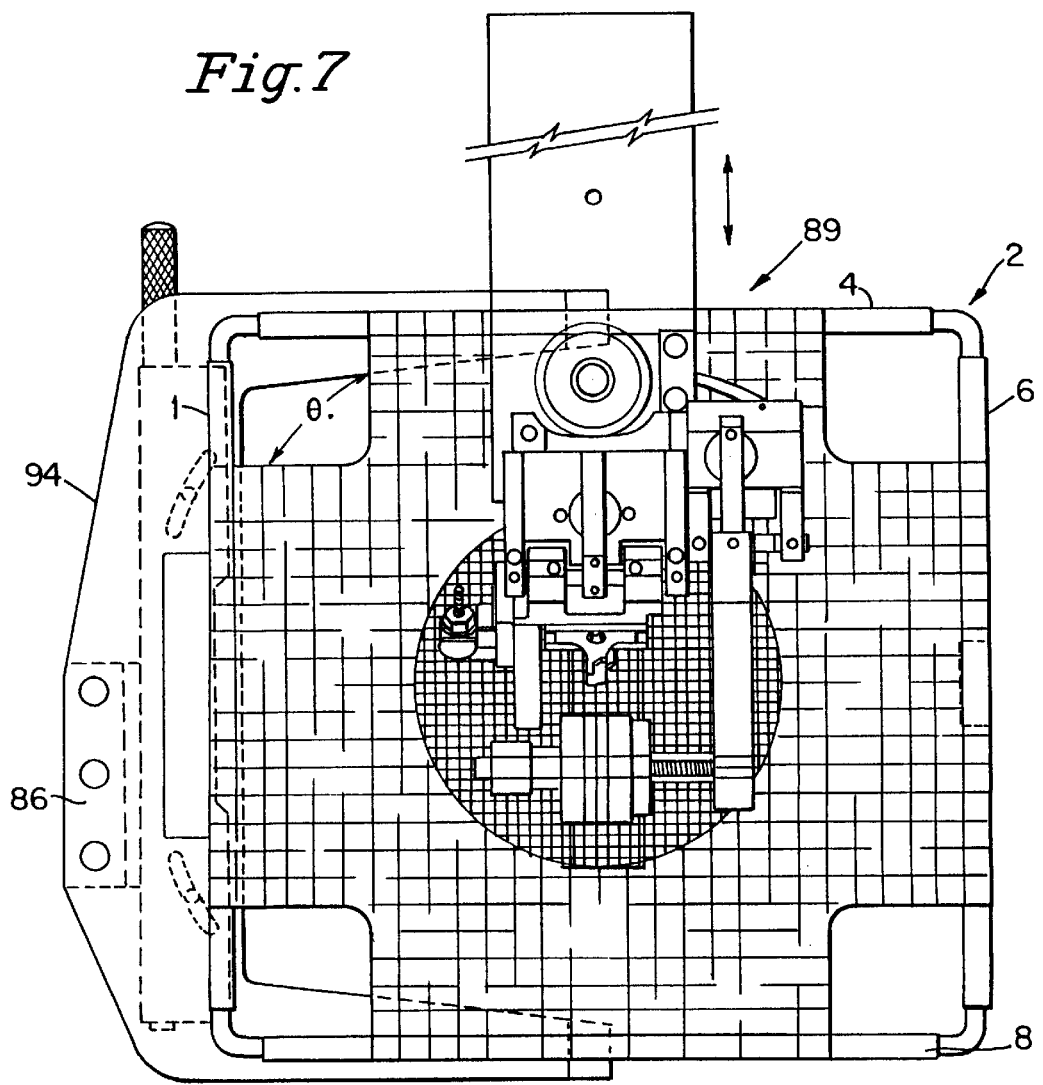
FIG. 7 illustrates the frame 2 as applied to the scribing and breaking machine of the aforesaid application.

Referring now specifically to FIGS. 7 and 8 of the accompanying drawings, the scribing and breaking machine 89 of application Ser. No. 08/109,760 is illustrated (to extent necessary to understand the present invention) as modified hereby.

The machine 89 has an index slide 90 for indexing the frame 2/film 26/wafer 64 assembly from left to right as viewed in FIG. 8. A block 92 is secured by conventional means, preferably screws, to the slide 90 and a plate 94 forming a part of a U-shaped member 96 is cantilevered therefrom.

Referring now to FIG. 9, a body 98 is secured to the U-shaped member 96 and has magnets 100 and 102 flush with surface 104 at the back of a slot 105 defined in the face of the member 98 facing the scribing and breaking elements of the mechanism. The magnets are employed to hold the frame 2 during the dicing operation. Studs or dowel pins 106 stick out from the surface 104 to permit proper positioning of the frame 2 in the recess 106. To remove the frame 2 from the body 98, there is provided a lever 110 which when rotated causes a leg 112 of the lever to protrude from the wall and push the frame 2 off of the magnets and cause it to be released.

The body 98 has a bottom lip 114 extending out further than the upper surface of the slot to provide additional support to the frame 2.

It should be noted that the U-shaped member has two legs, only one of which, leg 118, is illustrated. The legs of the U-shaped member 96 extend under the frame 2 to a point beyond the scribing and breaking region of the machine with the frame supported at the ends of the arms by thin blocks such as block 120.

When slicing is completed along, for instance the x axis, the frame is removed from the frame holder and rotated 90°. Slicing may again be performed along the x axis so that the individual chips are now formed and have been separated by the stretch provided along both axes of the wafer by the Swiss Cross and frame 2.

Figure 10:
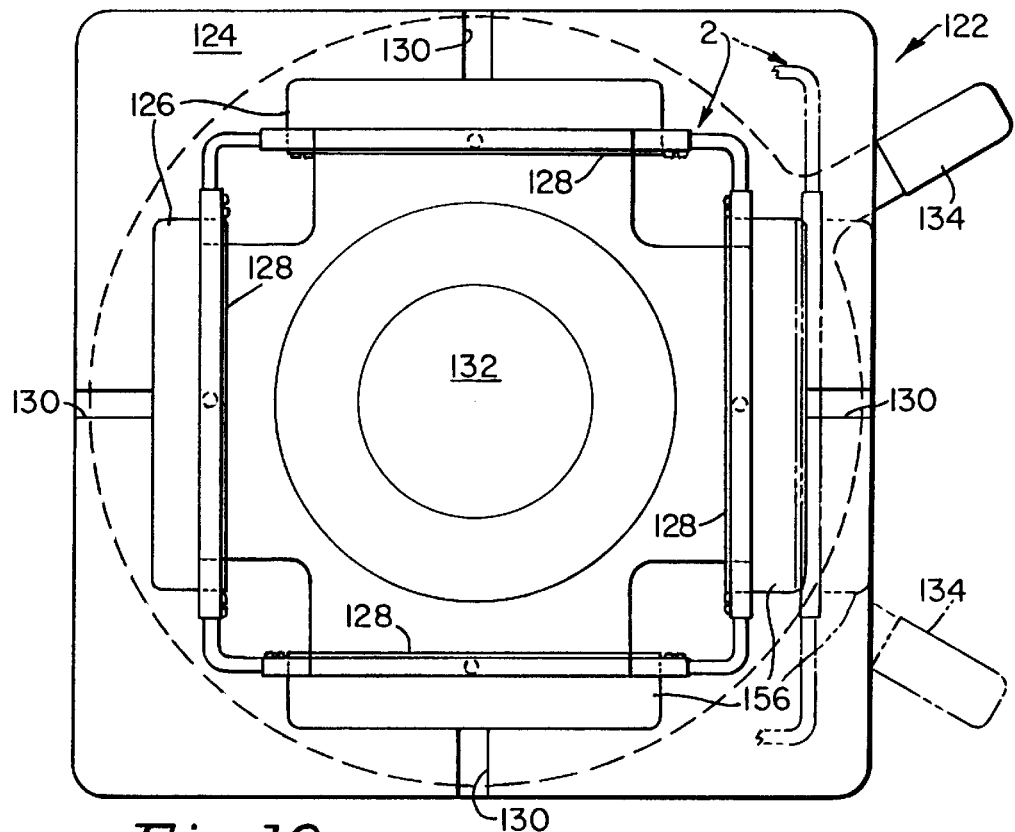
FIG. 10 is a top view of a wafer frame holder expander.

A frame expansion device 122 is illustrated in FIG. 10. The device comprises a square platform 124 having four identical translatable fixtures 126 each arranged parallel to its adjacent edge of the platform and having an upstanding lip 128. The fixtures 126 are slidable each in a different one of slots 130. In practice a hot disc 132 is placed in the center of the platform 124, the frame/film/wafer assembly is placed over the platform with each one of its side members placed outside of a lip 128. Lever 134 is now rotated and this causes the members 126 to move toward their adjacent edges, the heat transferred by the hot disc 132 to the film on which the chips are mounted softens the film allowing it to expand in the x and y directions. Thus the chips are separated from one another sufficiently to allow them to be removed from the film without damaging adjacent chips.

Figure 11:
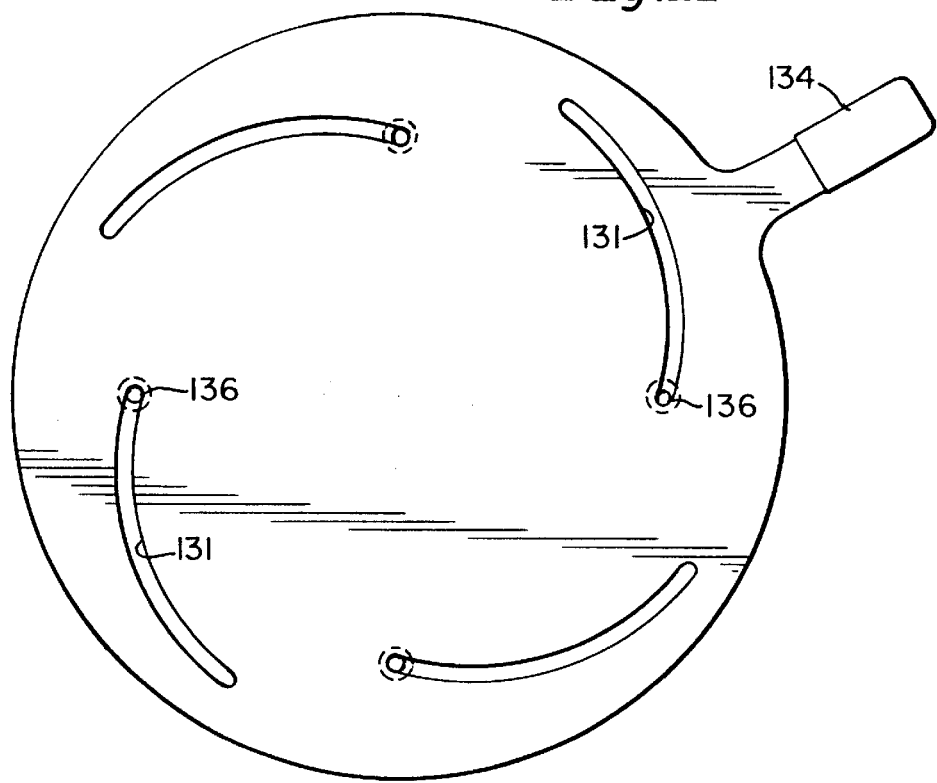
FIG. 11 is a view of a second eccentric for use with the frame expander of FIG. 11.

The movement of the fixtures 126 may be by the eccentric illustrated in FIG. 6 or by the eccentric illustrated in FIG. 11. In FIG. 11 slots 131 are curved and have bolts 136, with one mounted in each slot. Upon rotation of the handle as indicated, the bolts 136 which are threaded into the underside of fixtures 126 are moved toward the outer edges of the platform and the film is expanded.

Referring now to FIG. 12 of the accompanying drawings, the member 98 is modified as illustrated in FIG. 12. Instead of using magnets to hold the frame 2, a ball and detent arrangement is used. Specifically, the body 98 has been modified as body 98' to provide a spring biased ball 138 in the two sides of the recess 106. The frame corner members 10 and 16 have recesses formed in their sides, only one being illustrated by number 140. Thus the frame may be snapped into place and held rigidly.

The method of the present invention is as follows:
1) Place tape film 26 in film application fixture 44, and remove adhesive covers on ends of the Swiss Cross. The wafer adhesion side with its protective cover is facing down.
2) Place frame 2 expanded in the fixture 44 expanded.
3) Pull lever 69 to contract frame 2.
4) Push frame 2 into contact with film 26 and wrap ends of Cross around the four sides of frame 2.
5) Counter-rotate lever 69 to place the film under x-y tension.
6) Remove frame 2 and film 26 from fixture 44.
7) Remove center where wafer is to be placed from cover laminate on film 26 or remove entire laminate cover from adhesive on film 26. Adhesive that holds wafer is applied to the entire tape surface so one can strip off all or just a circle where wafer is to be placed.
8) Align pattern of wafer parallel to film application fixture 44 and put wafer, circuit side down, in cavity 64.
8a) Align pattern of wafer parallel to film application fixture 44 and put wafer, circuit side up, in cavity 64.
9) Reinstall frame and tape in frame without compressing.

10) Using a cotton tipped applicator or similar, iron film 26 onto back of wafer, taking care not to trap air between back of wafer and tape.

11) Remove frame 2, wafer and film 26 from film application fixture 44.

12) Peel remainder of cover laminate away if not already done.

13) The tape 26, wafer and frame 2 are now ready for installation in scribe/break machine and oriented relative to the mechanism of the machine.

14) After scribing and breaking insert frame 2, film 26, wafer assembly in the expansion fixture 122 to expand film and thus space the chips away from each other.

15) The chips may now be removed from the film.

16) As an added step the expanded film with the diced wafer may be exposed to ultraviolet light to cure the adhesive to reduce adhesion before removing the chips from the film.

Once given the above disclosure, many other features, modifications and improvements will become apparent to the skilled artisan. Such features, modifications and improvements are, therefore, considered to be a part of this invention, the scope of which is to be determined by the following claims.

What is claimed is:

1. Apparatus for providing separation between diced members produced by scribing and breaking comprising a symmetrically telescopic expandable frame of four hollow wide members having a central region, two open ends each, four corner members telescoped into the ends of the hollow wide members and four matched resilient members disposed in the hollow side members to exert outward forces on the corner members to provide an expanding force on the frame, means for compressing said frame, and an elastic material secured to the four side members of the frame.

2. Apparatus according to claim 1 further comprising means for insuring equal movement of the corner members upon exertion of said outward forces thereon by said resilient members.

3. Apparatus according to claim 2 wherein said means for insuring equal movement comprises, a pair of members each engaging a different one of said corner members telescoped into different ends of the same hollow side member, a pulley and endless belt array providing oppositely moving parallel regions of said belt array, and each of said pair of members coupled to a different one of said oppositely moving regions of said belt array.

4. Apparatus according to claim 1 wherein said elastic material has four arms each extending over a different one of said hollow side members.

5. Apparatus according to claim 4 wherein said elastic material has a band of adhesive along one side of each arm of the elastic material, each of said bands of adhesive for securing the elastic material to a different one of said side members of the frame when the frame is compressed by said means for compressing.

6. Apparatus according to claim 4 further comprising an adhesive on one side of said side members of said frame, said adhesive securing the arms of the elastic material to aid frame.

7. Apparatus according to claim 6 having a wafer to be diced secured to a center region of said elastic material.

8. Apparatus according to claim 6 further comprising an adhesive applied to a surface of the arms of the elastic material positioned to contact the adhesive applied to the side members of said frame.

9. Apparatus according to claim 8 wherein a wafer to be diced is located on the same side of the arms of the elastic material which adhesive has been applied.

10. Apparatus according to claim 8 further comprising means for positioning said frame on a machine for dicing a wafer mounted on said elastic material.

11. Apparatus according to claim 10 wherein said frame has a center said member having a center, means for rotating said frame about the center of the frame.

12. Apparatus according to claim 11 wherein said means for rotating comprises a support member for said frame on said machine, said support member having a fixture for holding said frame, said fixture being supported on said means for rotating therewith.

13. Apparatus according to claim 12 further comprising magnetic means for holding said frame in said fixture.

14. Apparatus according to claim 12 ball and detent means for retaining said frame in said fixture.

15. Apparatus according to claim 8 wherein said wafer is a wafer of gallium arsenide.

16. Apparatus according to claim 8 further comprising means for expanding the elastic material after dicing of a wafer sufficiently to permit conventional pick and place equipment to remove diced members from the elastic material.

17. Apparatus according to claim 8 wherein said wafer is semiconductor material.

18. Apparatus for providing separation between a plurality of thin members that have been separated from one another, comprising a symmetrically telescopic expandable frame of four hollow side members with two hollow ends each, four corner members telescoped into the ends of the hollow side members and four matched springs disposed in the hollow side members to exert outward forces on the corner members to provide an expanding force on the frame, means for compressing said frame, and an elastic material secured to the four side members of the compressed frame.

19. Apparatus for providing separation between diced members produced by scribing and breaking a wafer comprising a rectangular frame having four sides of two pairs of opposed sides, said frame being compressible such that opposed sides of the said frame are resiliently compressed on a pair by pair basis substantially equally towards one another, an elastic material located within the area defined by said sides of said frame and having regions extending over each of the sides of said frame, means for compressing said frame, said regions being securable to said frame when compressed, means securing a wafer to said elastic material when said frame is compressed, and means for releasing said frame from compression to stretch said elastic material.

20. The apparatus according to claim 19 further comprising means for providing approximately equal movement of said sides upon being released from compression.

* * * * *